(12) United States Patent
Heinonen et al.

(10) Patent No.: US 7,151,915 B2
(45) Date of Patent: Dec. 19, 2006

(54) DUAL MODE VOLTAGE CONTROLLED OSCILLATOR HAVING CONTROLLABLE BIAS MODES AND POWER CONSUMPTION

(75) Inventors: Jarmo Heinonen, Salo (FI); Vesa Viitaniemi, Toija (FI); Kai Leino, Salo (FI); Jyrki Koljonen, Salo (FI)

(73) Assignee: Nokia Corporation, Espoo (FI)

( * ) Notice: Subject to any disclaimer, the term of this patent is extended or adjusted under 35 U.S.C. 154(b) by 1116 days.

(21) Appl. No.: 09/964,367

(22) Filed: Sep. 26, 2001

(65) Prior Publication Data

US 2003/0060176 A1 Mar. 27, 2003

(51) Int. Cl.
*H04B 1/06* (2006.01)
(52) U.S. Cl. .................... 455/255; 455/265; 455/76
(58) Field of Classification Search ............. 455/265, 455/76, 112, 180.3, 183.1, 188.2, 147, 255, 455/264; 331/2, 34, 17, 18
See application file for complete search history.

(56) References Cited

U.S. PATENT DOCUMENTS

| 5,471,652 | A | 11/1995 | Hulkko |
| 5,926,071 | A | 7/1999 | Kukkonen |
| 2001/0029172 | A1 * | 10/2001 | Lee et al. ............. 455/234.1 |

FOREIGN PATENT DOCUMENTS

| EP | 0854566 A1 | 7/1998 |
| WO | WO-00/03490 | 1/2000 |

* cited by examiner

*Primary Examiner*—Melur Ramakrishnaiah
(74) *Attorney, Agent, or Firm*—Harrington & Smith,LLP

(57) ABSTRACT

Disclosed is an oscillator circuit (10) for use in a local oscillator of an RF communications device (100) that communicates over an RF channel. The oscillator circuit includes an oscillator transistor coupled to a power supply voltage (Vcc) through a buffer transistor, and a biasing network having bias voltage outputs coupled to a control input of the oscillator transistor and to a control input of the buffer transistor. In one embodiment the bias voltage network is coupled to Vcc, while in another embodiment the bias voltage network is coupled to a separate voltage (Vbias). Circuitry is provided for setting a magnitude of Vcc and/or Vbias as a function of at least one of RF channel conditions, such as channels conditions determined from a calculation of the (SNR), or an operational mode of the RF communications device. The magnitude of Vcc (and Vbias) may be set between about zero volts (i.e., turned off) and some maximum value. The operational mode can be, for example, one of a TDMA, burst-type narrow bandwidth mode, or a CDMA, substantially continuous, wider bandwidth mode. The value of Vcc and/or Vbias maybe set so as to minimize power consumption as a function of an amount of allowable local oscillator phase noise. A broad bandwidth/narrow bandwidth dual mode RF transceiver in accordance with these teachings includes at least one phase locked loop (PLL) that includes a voltage controlled oscillator (VCO) providing a local oscillator signal for at least one of an I/Q modulator or an I/Q demodulator; a processor responsive to an output of said I/Q demodulator for determining at least one aspect of RF channel quality; and circuitry coupled between the processor and the VCO for minimizing at least VCO power consumption as a function of an amount of allowable VCO phase noise for a current RF channel quality.

19 Claims, 7 Drawing Sheets

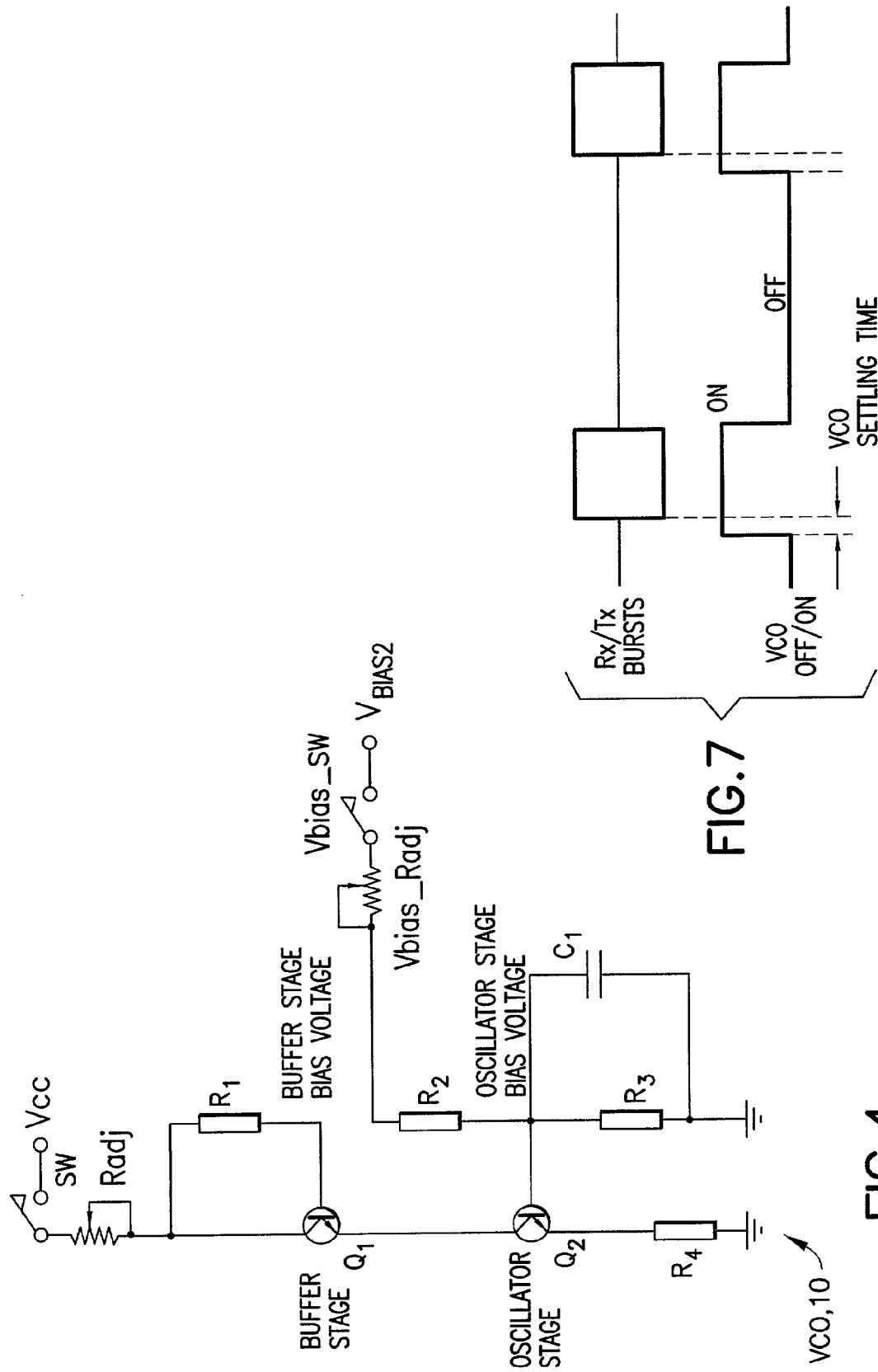

| FIG. 6A |
|---|
| FIG. 6B |

DUAL MODE VOLTAGE CONTROLLED OSCILLATOR HAVING CONTROLLABLE BIAS MODES AND POWER CONSUMPTION

TECHNICAL FIELD

These teachings relate generally to frequency sources and oscillators, and more specifically relate to voltage controlled oscillators used in mobile communication devices, in particular multi-mode mobile communication devices such as dual mode cellular telephones, also referred to herein as mobile stations.

BACKGROUND

A local oscillator (LO) signal is required for receiving and transmitting in a wireless (RF) communication device, such as a cellular telephone. A voltage controlled oscillator (VCO) is typically used in a phase-locked loop to generate the LO signal. The quality of the VCO signal, for example the phase noise, signal to noise floor, output power and environmental stability) that is required by the RF system strongly influences the current consumption. The current consumption is a very important consideration in portable, battery powered communication devices, as it impacts the duration of the talk and standby times between required battery recharging operations.

In different cellular systems different operational requirements are present, and the opportunities to reduce the power consumption thus differ as well. Also, different usage conditions and wireless network environments place different demands on the required quality of the VCO signal. For example, when no strong interference sources are present a lower quality VCO signal may be adequate.

When a mobile station is required to operate with only one cellular system, such as the Global System for Mobile Communications (GSM) system or a wideband code division multiple access (WCDMA) system, the VCO (and PLL) can be optimized for operation with that one specific system. However, in dual and higher mode mobile stations (e.g., GSM/WCDMA) the designer is faced with providing one VCO that is not entirely optimized for operation with either, or with providing multiple VCOs, one for each supported system. As can be appreciated, neither approach leads to an optimum reduced power consumption solution.

An example of the use of the multiple VCOs in a mobile station operable with different cellular networks can be found in U.S. Pat. No. 5,471,652, "Frequency Synthesizer and Multiplier Circuit Arrangement for a Radio Telephone", by Jaakko Hulkko.

Another example of a VCO used in a mobile station can be found in U.S. Pat. No. 5,926,071, "Minimization of the Power Consumption in an Oscillator", by Osmo Kukkonen. This patent presents a method for minimizing the current consumption and the operating voltage of a VCO, where the oscillator's RF output signal is detected as a DC voltage signal in a clamp/voltage multiplier circuit. The detected signal is supplied in a feedback loop to a field effect transistor (FET) that controls the oscillator's current. In this manner the FET controls the current to be a predetermined minimum value.

Conventionally VCOs having fixed bias voltage circuitry have been employed, and the bias voltage within the VCO has typically been heavily filtered. However, the amount of filtering must be controlled so as not to make the VCO too slow to stabilize when switching channels.

Also, in conventional usage the VCO has been powered on all the time in the conversation mode, while in the receive/idle mode the VCO has the fixed bias level, and is switched off only when it is determined that it will not be required again for some predetermined period of time (that is typically longer than the time for one or several bursts in a TDMA-type system, or some hundreds of microseconds).

SUMMARY OF THE PREFERRED EMBODIMENTS

The foregoing and other problems are overcome, and other advantages are realized, in accordance with the presently preferred embodiments of these teachings.

Disclosed is an oscillator circuit for use in a local oscillator of an RF communications device that communicates over an RF channel. The oscillator circuit includes an oscillator transistor coupled to a power supply voltage (Vcc) through a buffer transistor, and a bias voltage network having bias voltage outputs coupled to a control input of the oscillator transistor and to a control input of the buffer transistor. In one embodiment the bias voltage network is coupled to Vcc, while in another embodiment the bias voltage network is coupled to a separate voltage (Vbias). Circuitry is provided for setting a magnitude of Vcc and/or Vbias as a function of at least one of RF channel conditions, such as channels conditions determined from a calculation of the (SNR), or an operational mode of the RF communications device. The magnitude of Vcc (and Vbias) may be set between about zero volts (i.e., turned off) and some maximum value. The operational mode can be, for example, one of a TDMA, burst-type narrow bandwidth mode, or a CDMA, substantially continuous, wider bandwidth mode. The value of Vcc and/or Vbias may be set so as to minimize power consumption as a function of an amount of allowable local oscillator phase noise.

A broad bandwidth/narrow bandwidth dual mode RF transceiver in accordance with these teachings includes at least one phase locked loop (PLL) that includes a voltage controlled oscillator (VCO) providing a local oscillator signal for at least one of an I/Q modulator or an I/Q demodulator; a processor responsive to an output of said I/Q demodulator for determining at least one aspect of RF channel quality; and circuitry coupled between the processor and the VCO for minimizing at least VCO power consumption as a function of an amount of allowable VCO phase noise for a current RF channel quality.

In order to reduce overall power consumption it may be possible to turn off the VCO and possibly also the associated PLL loop, such as when no signal is being received or transmitted. This approach implies that sufficient time be allocated when turning the VCO and PLL back on to settle these circuits to a stable operational state.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 4 is a simplified circuit diagram showing the tuning of either one or both of the supply voltage and bias voltage of the VCO, including the use of a separate bias voltage (Vbias2) for the oscillator transistor to adjust the VCO performance and power consumption;

FIG. 7 is an exemplary waveform and timing diagram showing the turning off and on of the VCO in a TDMA reception/transmission mode of operation;

DETAILED DESCRIPTION OF THE PREFERRED EMBODIMENTS

Figures 1, 2, 3:
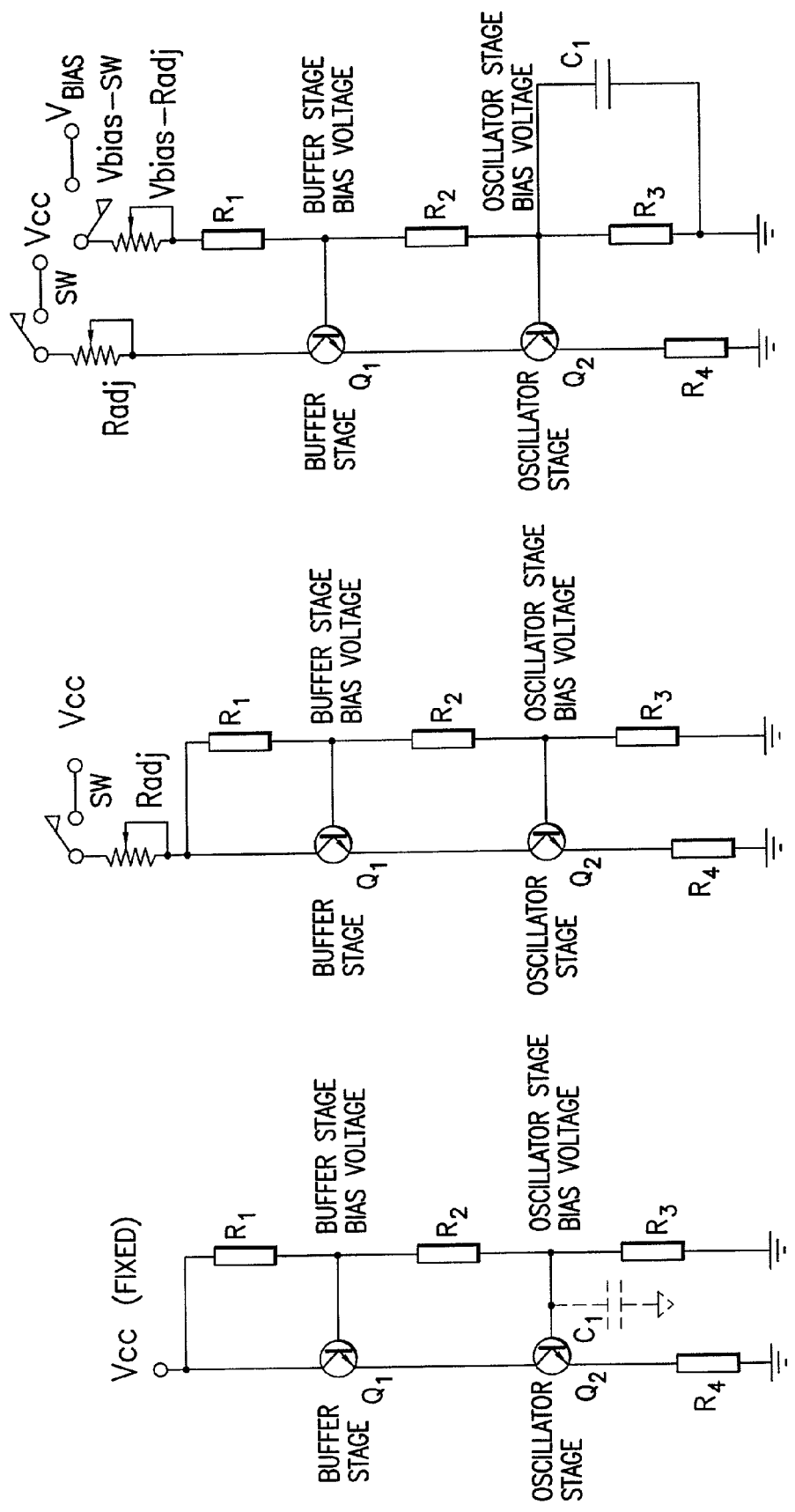
FIG. 1 is a simplified circuit diagram of a conventional VCO having a fixed VCC/bias supply.
FIG. 2 is a simplified circuit diagram showing the tuning of the supply voltage of the VCO to adjust its performance and power consumption.
FIG. 3 is a simplified circuit diagram showing the tuning of either one or both of the supply voltage and bias voltage of the VCO to adjust its performance and power consumption.

FIG. 1 is a simplified circuit diagram of a portion of a conventional VCO 1 having a fixed VCC/bias supply. The VCO 1 includes a buffer stage transistor Q1, an oscillator stage transistor Q2, and a plurality of resistances or impedances shown generally as R1, R2, R3 and R4, connected as shown. In general, R1, R2 and R3 are series connected between Vcc and circuit ground, and a bias voltage for Q1 is developed between R1 and R2, and a bias voltage for Q2 is developed between R2 and R3. An optional noise reduction filter capacitor C1 may be connected from the biasing point of Q2 to ground, however its presence can adversely affect the response and turn-on times of the VCO. In this conventional embodiment the value of VCC is not specifically tuned based on the operating condition or mode of the VCO, but instead may be fixed by the output of a voltage regulator that experiences normal fluctuations based on load, temperature and the like.

FIG. 2 is a simplified circuit diagram showing the tuning of the supply voltage of a VCO 10 to adjust its performance and power consumption, in accordance with an aspect of these teachings. In this embodiment the value of Vcc is made adjustable (shown for convenience as an adjustable resistor (Radj)), and it may also be turned off and on (shown for convenience as a switch (SW)). In this latter case it is preferred that the oscillator bias voltage filter capacitor C1 of FIG. 1 not be used, or if it is that its value be made small, so as not to detrimentally affect the turn-on and turn-off times of Q2.

FIG. 3 is a simplified circuit diagram showing the tuning of the supply voltage of the VCO 10 to adjust its performance and power consumption, as in FIG. 2, and further shown in this embodiment is that the bias voltage Vbias can be decoupled from Vcc, and can also be made adjustable and/or switchable on/off using Vbias_Radj and Vbias_SW. While Vbias may be sourced from a separate supply, it may also be supplied by Vcc. In this manner the value of Vbias can be separately controlled and optimized, and switched on and off as well, in order to change the performance and power consumption of the VCO 10. The optional bias filter capacitor C1 is also shown in this diagram.

FIG. 4 is a simplified circuit diagram showing the tuning of the supply voltage of the VCO 10 to adjust its performance and power consumption, as in FIG. 2, and in a further embodiment that the bias voltage Vbias for the oscillator Q2 is made separately variable and/or switchable on/off using Vbias_Radj and Vbias_SW. In this manner the value of Vbias for the oscillator transistor Q2, referred to as Vbias2, can be separately controlled and optimized, and switched on and off as well, in order to change the performance and power consumption of the VCO 10. The optional bias filter capacitor C1 is also shown in this circuit diagram. Note that the main current path through Q1 and Q2 (collector current) is isolated from C1, and thus is enabled to be switched on and off in a rapid manner.

Figure 5:
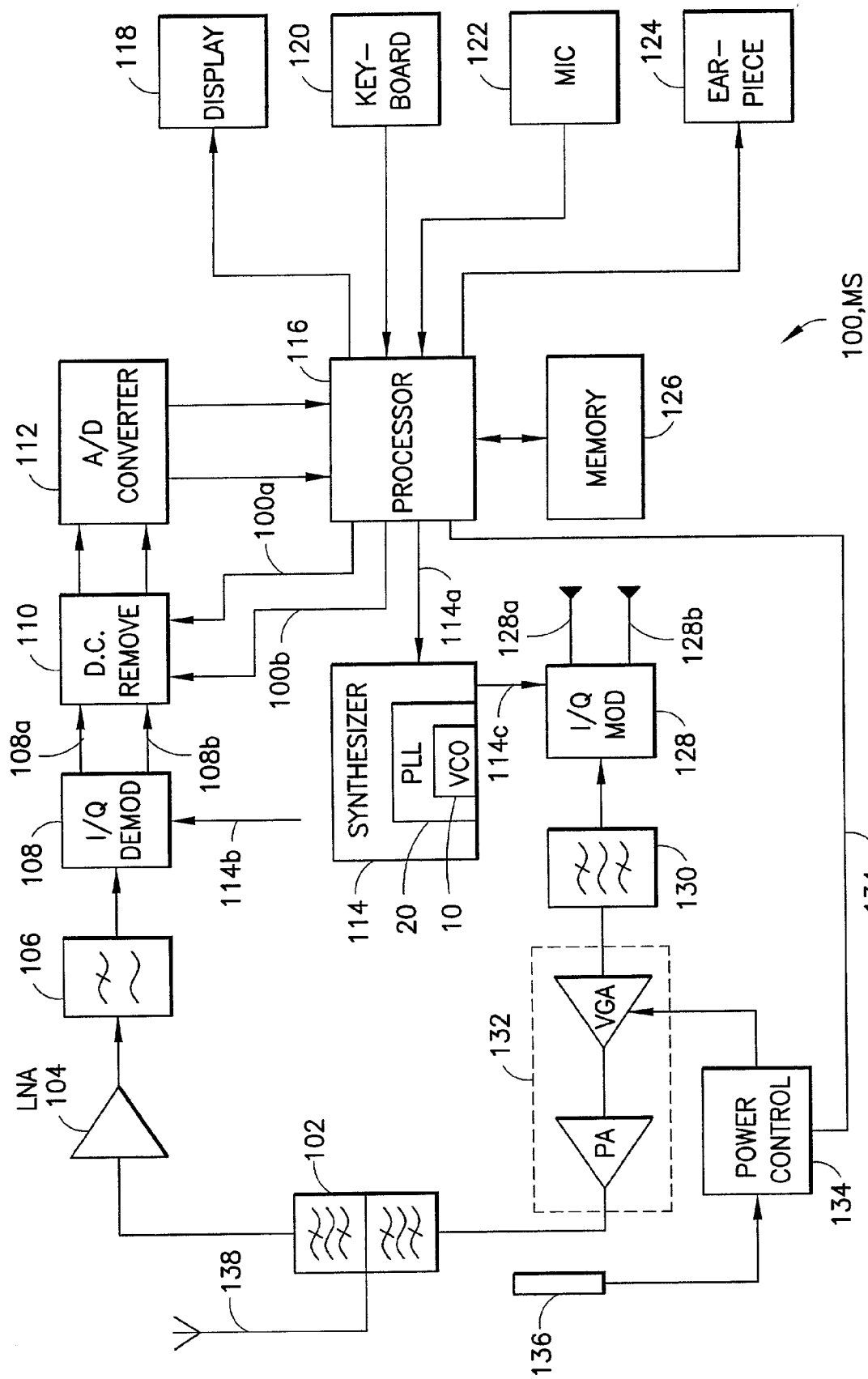
FIG. 5 is a block diagram of a mobile station this constructed and operated in accordance with these teachings.

Reference is made now to FIG. 5 for showing a VCO 10 and a PLL 20 in the context of a wireless communication terminal transceiver, such as a cellular telephone, also referred to herein for simplicity as a mobile station 100. More specifically, FIG. 5 is a block diagram of a transmitter-receiver (transceiver) of the mobile station 100, wherein the receiver is embodied as direct conversion receiver. An RF signal received by an antenna 138 is conducted via a duplex filter 102 to a low noise amplifier (LNA) 104. The purpose of the duplex filter 102 is to permit the use of the same antenna both in transmitting and in receiving. Instead of the duplex filter 102, a synchronous antenna changeover switch could be used in a time-division system. An RF signal output from the LNA 104 is low-pass filtered 106 and demodulated in an I/Q demodulator 108 into an in-phase (I) signal 108a and into a quadrature (Q) signal 108b. A local oscillator signal 114b, used for I/Q demodulation, is received from a synthesizer 114. The synthesizer 114 contains the PLL 20 and the VCO 10, described in further detail below in regard to FIG. 6. In block 110, the removal of a DC voltage component is carried out, as is automatic gain control (AGC). Block 110 is controlled by a processing block 116 that may contain, for example, a microprocessor. Automatic gain control is regulated by a signal 110a and removal of the offset voltage is regulated by a signal 110b. The analog signals output from block 110 are converted into digital signals in block 112, and from which the digital signals are transferred to digital signal processing circuits in the processing block 116.

The transmitter portion of the mobile station 100 includes an I/Q modulator 128 that forms a carrier frequency signal from an in-phase (I) signal 128a and from a quadrature (Q) signal 128b. The I/Q modulator 128 receives a local oscillator signal 114c from the synthesizer 114. The generated carrier frequency signal is low-pass filtered and/or high-pass filtered by a filter 130 and is amplified by an RF amplifier 132 containing a variable gain amplifier (VGA) and a power amplifier (PA). The amplified RF signal is transferred via the duplex filter 102 to the antenna 138. A transmitter power control unit 134 controls the amplification of the RF amplifier 132 on the basis of the measured output power 136 and in accordance with a control signal 134a received from the processor 116.

The processor 116 also controls the synthesizer 114 using a programming line or bus 114a, whereby the output frequency of the synthesizer 114 is controllably changed, as when tuning to different transmission and reception channels and/or to different frequency bands. The processor 116 can include a digital signal processor DSP) 116A, shown in FIG. 6 and described in further detail below.

For completeness FIG. 5 also shows, connected to the processor 116, a memory unit 126 and a user interface having a display 118, a keyboard 120, a microphone 122 and an earpiece 124.

Figures 6, 6A:
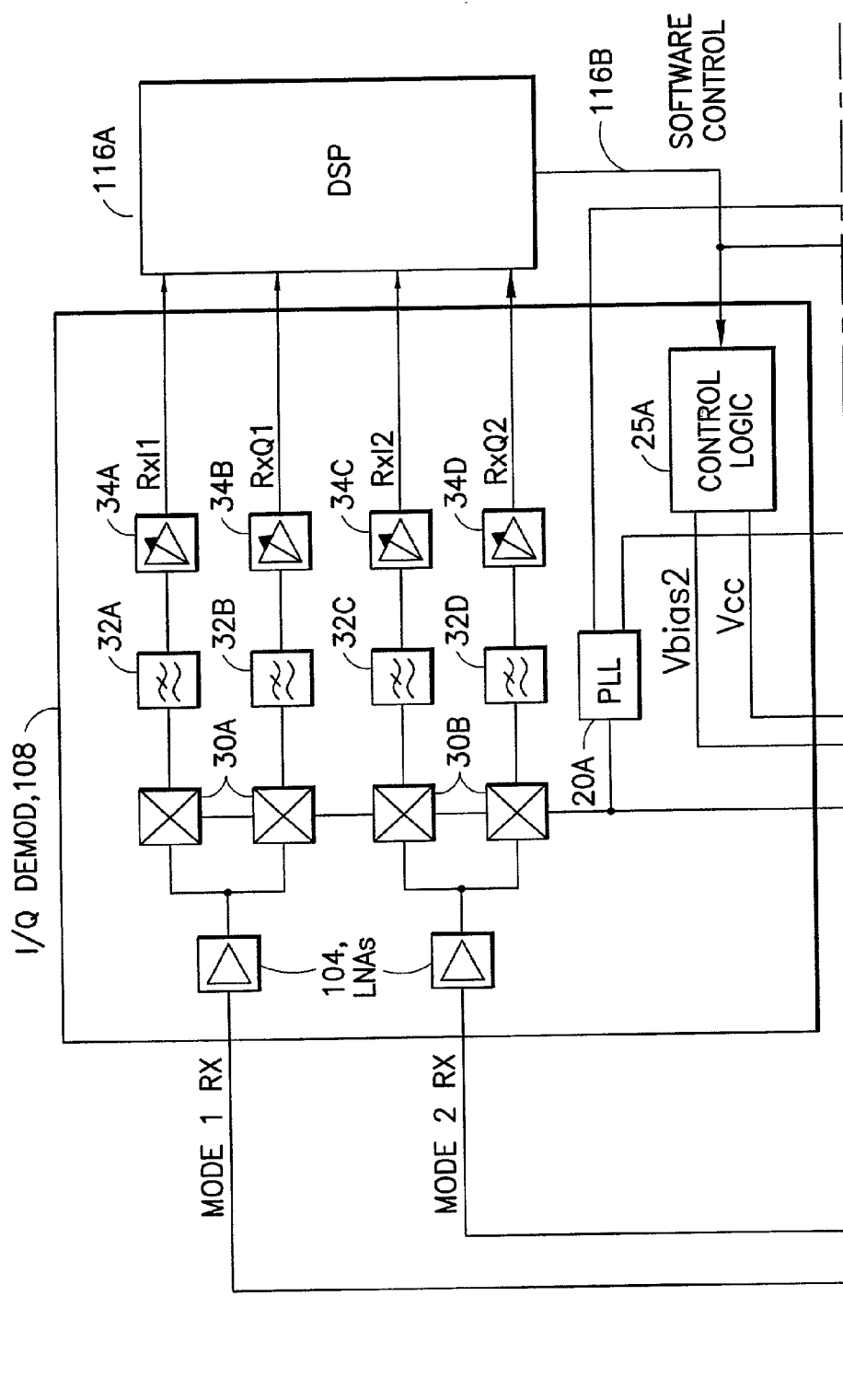
FIG. 6 is a block diagram that shows a portion of mobile station of FIG. 5 in greater detail, in particular the use of transmit (TX) and receive (RX) VCOs that are operated and controlled in accordance with these teachings.
Figure 6B:
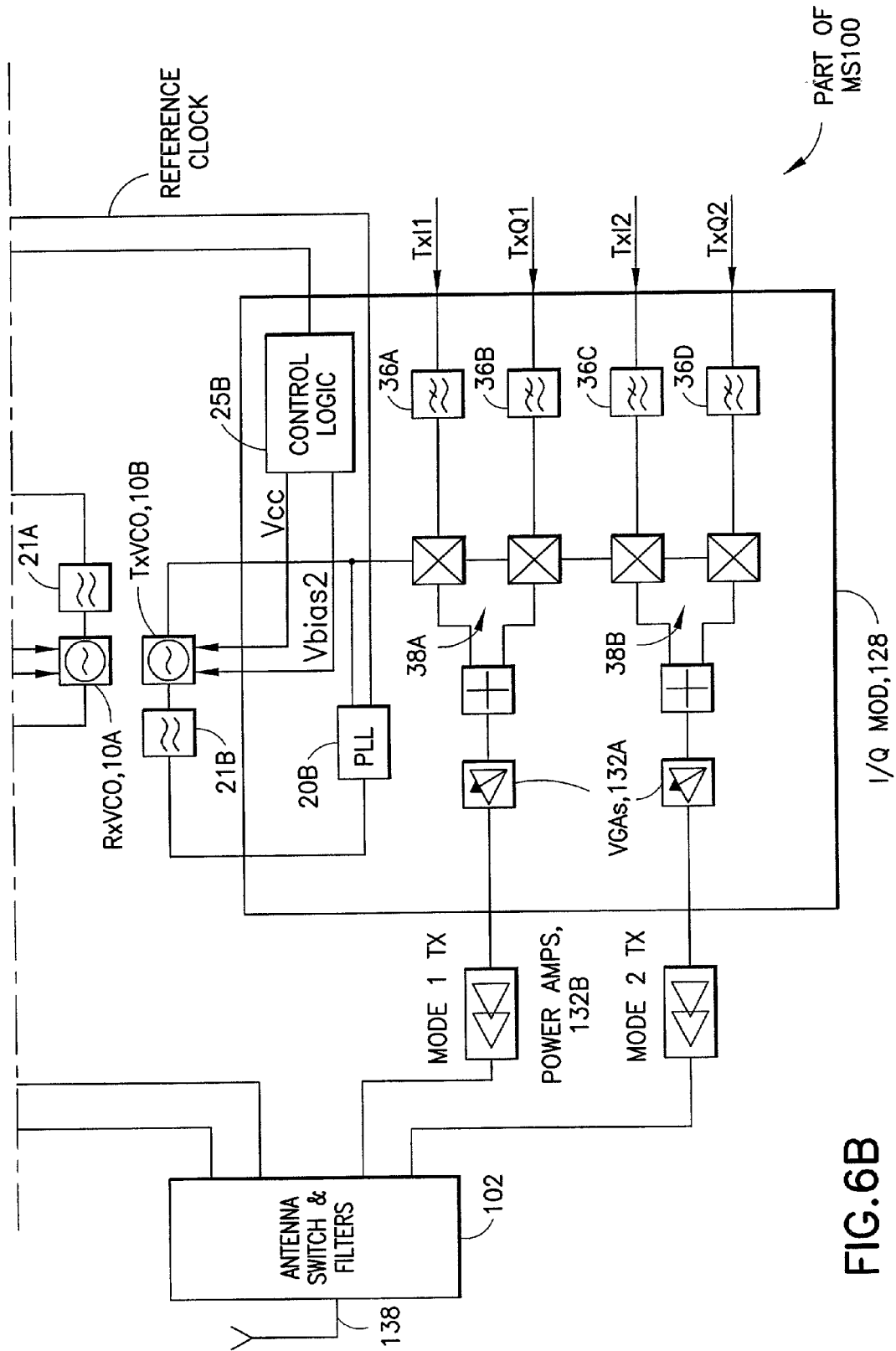

FIG. 6 shows in greater detail the construction of the I/Q demodulator 108 and the I/Q modulator 128, as well as the synthesizer 114 and the DSP 116A for a dual mode (Mode 1, Mode 2) embodiment. As an example, Mode 1 is a TDMA GSM mode, while Mode 2 is WCDMA mode. Shown in the receive (RX) path in this exemplary embodiment are separate LNAs 104, a plurality of I/Q mixers 30A, 30B and associated filters 32A–32D, and variable gain amplifiers 34A–34D outputting, at any given time, either the received Mode 1 I/Q signals (RXI1, RXQ1) or the Mode 2 I/Q signals (RXI2, RXQ2) to the DSP 116A. The receive PLL 20A and associated RX_VCO 10A function as a local oscillator (LO) and provide the mixing frequency to the I/Q mixers 30A, 30B. The DSP 116A outputs over a control bus 116B control information to receive control logic 25A, which in turn outputs the Vcc and Vbias2 voltages to the RX_VCO 10A (this example thus assumes the embodiment of FIG. 4, but is not limited for use only within this embodiment, as the embodiments of FIGS. 2 and 3 could be utilized as well.) The control logic 25A also implements the switching on and off of these voltages. As such, the control logic 25A may be implemented using a plurality of D/A converters for converting digital data from the DSP 116A into corresponding voltages Vcc and Vbias2 for the RX_VCO 10A, and thereby implements the functions shown generally as the variable resistances Radj and Vbias_Radj, and the switches SW and Vbias_SW, in FIG. 4.

The transmit (TX) side is constructed so as to basically mirror the RX side, and includes a plurality of input filters 36A–36D for the incoming TXI1, TXQ1 and TXI2, TXQ2 signals to be transmitted. Mode 1 and 2 I/Q modulators 38A and 38, respectively, receive their respective mixing frequencies from the PLL 20B/TX_VCO 10B, and provide their outputs to variable gain amplifiers (VGAs) 132A and power amplifiers 132B, shown collectively in FIG. 5 in circuit block 132. As in the receive side, the DSP 116A controls the magnitudes of the TX_VCO 10B Vcc and Vbias2 voltages using TX control logic block 25B.

For completeness each of the RX and TX PLLs 20A and 20B is shown to contain a loop filter 21A, 221B, respectively, and receives a (common) reference clock.

The specific mobile station 100 construction shown in FIGS. 5 and 6 is exemplary, and is not to be construed in a limiting sense upon the practice of these teachings. For example, a superheterodyne type of RF architecture could be employed in other embodiments, as opposed to the direct conversion architecture depicted in FIGS. 5 and 6.

Based on the foregoing it can be appreciated that these teachings provide a VCO 10 that has different bias modes, for example one for the GSM mode and one the WCDMA mode. There may be different bias currents, and hence different amounts of power consumption, used when the spectral environment of the MS 100 changes. For example, burst-type GSM-based systems typically require better signal quality at the receiver when high interference levels are present, while WCDMA-based systems require low VCO power consumption as the VCO 10 must be turned on almost continuously during the conversation mode or state. The required VCO 10 output level also determines the power consumption. For example, the output level required is dependent on the Signal-to-Noise (SNR) requirements and the circuitry to be driven. In general, it is desired to operate so that the VCO level is at or near the minimum required level so that the power consumption can be minimized.

Referring to FIG. 7, with systems using time division duplex (TDD) it is possible to shut off the VCO 10A, 10B and the PLL 20A, 20B for certain periods between received and/or transmitted bursts. In this case it is preferred to shut off the primary VCO current (collector current of Q2) and to leave the bias voltages (base currents) on. This also provides the opportunity to perform optimum low noise, low frequency filtering for these critical bias voltages, to avoid the amplification of noise at the base of the oscillator transistor Q2. When RC filtering is employed, the decoupling of the base and collector currents, as in FIG. 4, does not negatively impact the turn on and turn off times of Q2, as the collector current path not connected to the filter capacitor C1. The settling time of the VCO 10 is thus made faster, making this type of operation feasible using low cost and readily fabricated circuitry.

In order to control the levels of Vcc and Vbias2, the Signal to Noise Ratio (SNR) of the received signal can be calculated by the DSP 116A in a conventional manner, and then used to determine the bias/current level of the VCO 10. The SNR may be calculated as often as is desired, and the magnitudes of Vcc and/or Vbias2 also controlled as often as desired, preferably in real-time or in near-real time in order to accommodate the changing propagation conditions of the radio channel. When the SNR is found to exceed some threshold, and the VCO 10 cannot be shut off, then Vcc can be reduced, along with Vbias2, to run the VCO 10 in a lower power consumption mode. If the SNR is found to be degrading over time, for example in a TDMA or a WCDMA embodiment, then the DSP 116A is enabled to increase the Vcc and Vbias2 levels of the VCOs 10A and 10B until the SNR is at an acceptable level, or until a maximum Vcc/Vbias2 level is reached. Using these teachings the MS 100 is enabled to adjust or tune the phase noise of the VCO according to the mode of operation of the transceiver, and to thus control the amount of current consumption as a function of the required VCO signal quality. Furthermore, and as was shown in FIG. 7, the VCO 10 and PLL 20 can be switched off when not needed, such as between bursts in a narrow band (TDMA) made.

In general, the SNR calculated by the DSP 116A provides good information regarding the quality of the received signal, as it includes the entire signal path with all gain stages, filtering, saturation, VCO/PLL-based noise and so on. Furthermore, the signal used for the SNR calculation is in the digital domain after A/D conversion, and thus includes any disturbances that may be introduced by digital filtering and the like.

It has been known to calculate the SNR using DSP 116A software for enabling the sleep stage or mode of the MS receiver. However, the SNR information is available as well in the idle mode and in the conversation mode. By using this information it is possible to detect the reduction in performance (lowering of the SNR, and related increases in the Bit Error Rate (BER) and/or Block Error Rate (BLER)), and to compensate by increasing the performance of the VCO 10. When propagation conditions improve, the performance of the VCO 10 can be reduced accordingly, thereby reducing power consumption and prolonging battery life.

Other parameters and metrics can be determined and used as well, such as a received signal strength indicator (RSSI), signal to interference ratio (SIR) and/or the received signal code power (RSCP). Combinations of these and other metrics may be made in order to determine the optimum settings for the VCO 10 Vcc and/or Vbias 2 voltages. The employed metrics may also change as the operational mode is changed (e.g., from a TDMA mode to a CDMA mode and vice versa).

Other parameters, such as the mixer and I/Q demodulator 108 currents and other signal dependant RF stages can also be optimized for low current consumption, such that when the signal quality degrades additional power/current/voltage in provided to the affected stage(s) to increase their performance.

As was mentioned, in the WCDMA mode of operation the continuous current consumption of the receiver is important because, for example in the talk mode or conversation state, the receiver is on almost continuously. Thus, a large benefit is realized by using low amounts of battery current in those typical conditions where the transmitter level is low and/or in a signal environment at the receiver input that is "clean" (i.e., free of high disturbing levels and interference). Furthermore, in the WCDMA system the transmitter of the MS 100 can cause receiver saturation when transmitting at high levels and when the receiver is operating with low currents/voltages.

However, the WCDMA may be only one mode out of two or more in the MS 100, so that the problems introduced by its operation may disappear when operating in another mode, such as the TDMA GSM mode, or in a multi-media mode. The teachings of this invention enable one to better optimize the performance of MS 100 for different modes and conditions, and to optimize the power consumption to the current mode of operation.

The SNR calculated by the DSP 116A can be used as well for other purposes, such as tuning the timing of certain RF functions, changing the states of the receiver, for example changing the states of certain gain stages, as well as to generally optimize the receiver performance, such as sensitivity, blocking and adjacent time slot performance.

Typical Vcc voltages that may be employed are in the range of about 2.7 to 1.8 volts, and the value of Vbias depends on the value of Vcc. For the case where narrowband and wideband modes are used examples include, but are not limited to, a GSM/WCDMA embodiment wherein the GSM channel spacing is 200 kHz and the WCDMA channel spacing is 5 Mhz.

Figure 8A:
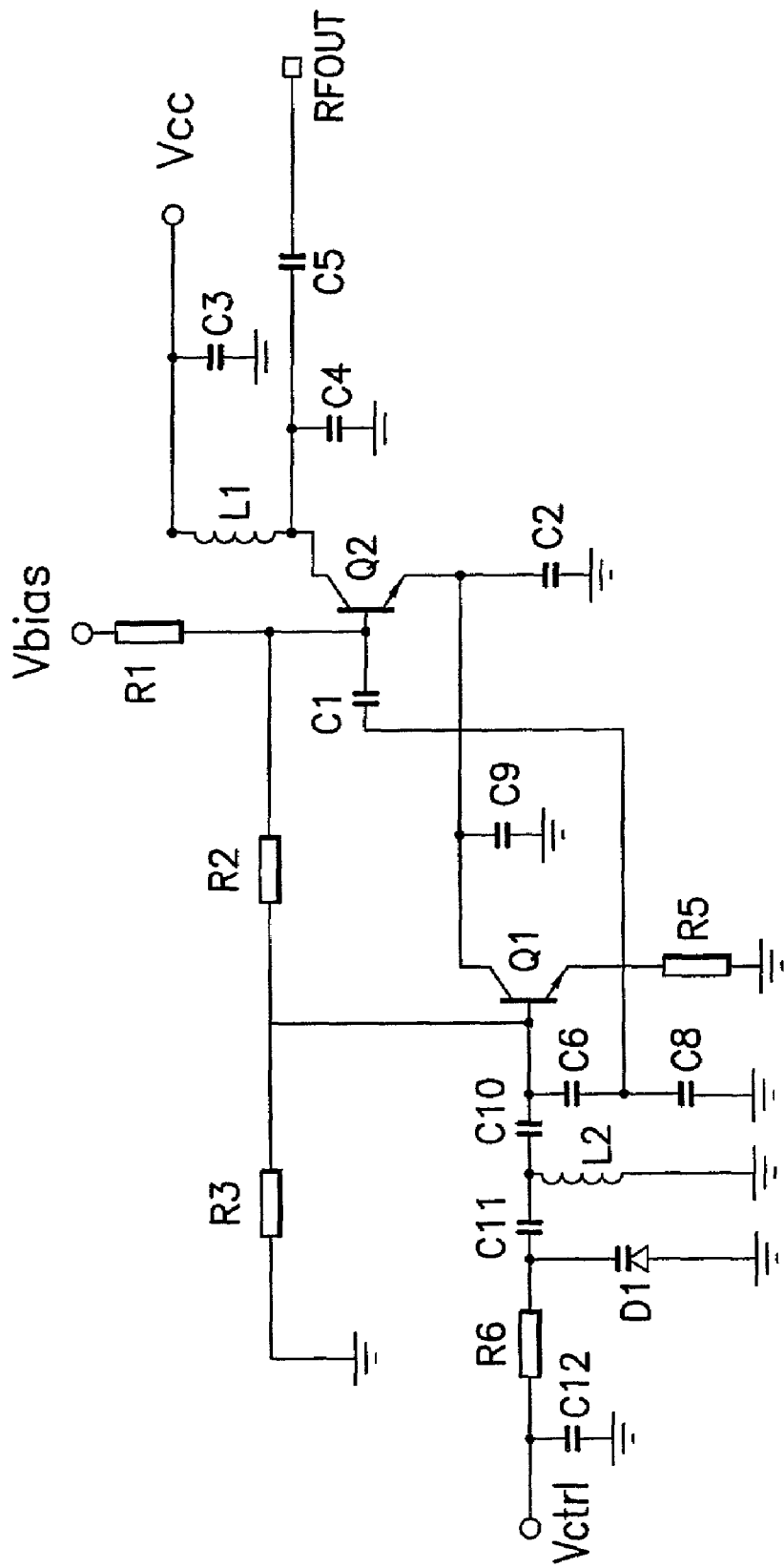
FIG. 8A illustrates a more detailed schematic diagram of the VCO of FIG. 3.
Figure 8B:
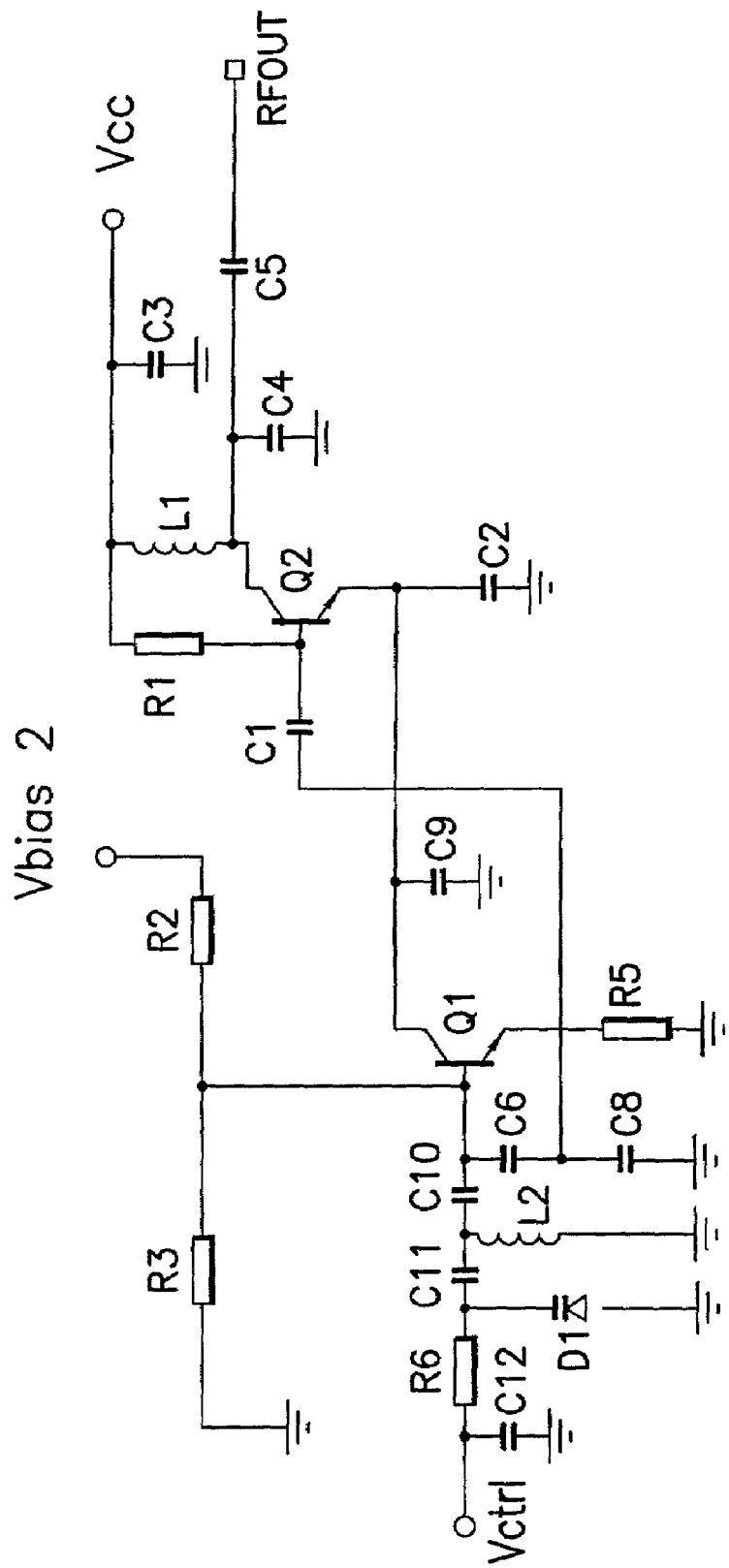
FIG. 8B illustrates a more detailed schematic diagram of the VCO of FIG. 4.

It can be appreciated that the schematic diagrams of FIGS. 2, 3 and 4 were greatly simplified in order to more clearly illustrate the teachings of this invention. For a more practical (and exemplary) embodiment reference can be made to FIGS. 8A and 8B, where FIG. 8A is a more detailed schematic diagram of the VCO 10 of FIG. 3 and FIG. 8B is a more detailed schematic diagram of the VCO 10 of FIG. 4. Note that these schematic diagrams are based on FIG. 1 of U.S. Pat. No.: 5,926,071 (incorporated by reference herein). However, as compared to FIG. 1 of U.S. Pat. No. 5,926,071 the designations of Q1 and Q2 are reversed, and R1, R2 and R3 are renumbered, so as to agree with the numbering scheme of FIGS. 3 and 4. These schematic diagrams are provided merely as examples to show the voltage control (Vctrl) input to Q1, the RF output node (RFOUT) of the VCO 10, as well as a more practical circuit implementation of VCOs that incorporate the teachings of this invention. In FIGS. 8A and 8B the magnitude of Vcc is assumed to be adjustable, as is the magnitude of Vbias and Vbias2, as was discussed in detail above.

The specific circuitry shown in FIGS. 8A and 8B is not intended to be viewed as a limitation upon the practice of this invention, as those skilled in the art will recognize that other circuit embodiments having more or fewer components could be employed to construct a working VCO. Further in this regard, it should also be realized that in some embodiments the buffer stage transistor Q1 could be eliminated, and RFOUT taken through C1 from the upper end of R5 in FIGS. 8A and 8B. In this case Vcc is fed directly to Q1, and not through Q2. It is also within the scope of these teachings that each of Q1 and Q2 have their own Vcc supply.

Thus, it should be appreciated that while these teachings have been presented in the context of certain presently preferred embodiments, that changes in form and detail may be made by those skilled in the art, when guided by these teachings, and that these changes will still fall within the scope of the teachings of this invention.

What is claimed is:

1. An oscillator circuit for use in a local oscillator of an RF communications device that communicates over an RF channel, said oscillator circuit comprising an oscillator transistor coupled to a power supply voltage (Vcc) through a buffer transistor and a biasing network having bias voltage outputs coupled to a control input of said oscillator transistor and to a control input of said buffer transistor, said bias voltage network being coupled to Vcc, and further comprising circuitry for setting a magnitude of Vcc as a function of at least one of RF channel conditions or an operational mode of the RF communications device, wherein the value of Vcc is set so as to minimize power consumption as a function of an amount of allowable local oscillator phase noise, and where Vcc is coupled to said oscillator transistor directly or via a buffer transistor.

2. An oscillator circuit as in claim 1, wherein said RF channel conditions are determined by calculating a signal-to-noise ratio (SNR).

3. An oscillator circuit as in claim 1, wherein the magnitude of Vcc is set between about zero volts and some maximum value.

4. An oscillator circuit as in claim 1, wherein said operational mode is one of a TDMA mode or a CDMA mode.

5. An oscillator circuit as in claim 1, wherein said operational mode is one of a burst transmission and reception mode or a substantially continuous transmission and reception mode.

6. An oscillator circuit as in claim 1, wherein said operational mode is one of a narrow bandwidth mode or a wider bandwidth mode.

7. An oscillator circuit for use in a local oscillator of an RF communications device that communicates over an RF channel, said oscillator circuit comprising an oscillator transistor coupled to a power supply voltage (Vcc) through a buffer transistor and a bias voltage network having bias voltage outputs coupled to a control input of said oscillator transistor and to a control input of said buffer transistor, said bias voltage network being coupled to another power supply voltage Vbias, and further comprising circuitry for setting a magnitude of both Vcc and Vbias as a function of at least one of RF channel conditions or an operational mode of the RF communications device, wherein the values of Vcc and Vbias are set so as to minimize power consumption as a function of an amount of allowable local oscillator phase noise.

8. An oscillator circuit as in claim 7, wherein said RF channel conditions are determined by calculating a signal-to-noise ratio (SNR).

9. An oscillator circuit as in claim 7, wherein the magnitude of Vcc and Vbias is set between about zero volts and some maximum value.

10. An oscillator circuit as in claim 7, wherein said operational mode is one of a TDMA mode or a CDMA mode.

11. An oscillator circuit as in claim 7, wherein said operational mode is one of a burst transmission and reception mode or a substantially continuous transmission and reception mode.

12. An oscillator circuit as in claim 7, wherein said operational mode is one of a narrow bandwidth mode or a wider bandwidth mode.

13. A broad bandwidth/narrow bandwidth dual mode RF transceiver, comprising:
   at least one phase locked loop (PLL) that includes a voltage controlled oscillator (VCO) providing a local oscillator signal for at least one of an I/Q modulator or an I/Q demodulator;
   a processor responsive to an output of said I/Q demodulator for determining at least one aspect of RF channel quality; and
   circuitry coupled between said processor and said VCO for minimizing at least VCO power consumption as a function of an amount of allowable VCO phase noise for a current RF channel quality.

14. A dual mode RF transceiver as in claim 13, wherein at least said VCO can be turned off between bursts when operating in said narrow bandwidth mode.

15. A dual mode RF transceiver as in claim 13, wherein a magnitude of one or both of a VCO supply voltage Vcc and a VCO biasing supply voltage Vbias are variable by said circuitry for varying the power consumption of said VCO.

16. A dual mode RF transceiver as in claim 15, wherein the magnitude of Vcc and Vbias is variable between about zero volts and some maximum value.

17. A dual mode RF transceiver as in claim 13, wherein said RF channel quality is determined by calculating a signal-to-noise ratio (SNR).

18. A method for operating a broad bandwidth/narrow bandwidth dual mode RF transceiver, comprising:
   operating at least one phase locked loop (PLL) that includes a voltage controlled oscillator (VCO) to provide a local oscillator signal for at least one of an I/Q modulator or an I/Q demodulator;
   responsive to an output of said I/Q demodulator, determining at least one aspect of RF channel quality; and
   minimizing at least the power consumption of said VCO as a function of an amount of allowable VCO phase noise for a current RF channel quality.

19. A method as in claim 18, and further comprising turning off at least said VCO between bursts when operating in said narrow bandwidth mode.

* * * * *